(12) United States Patent
Dobashi et al.

(10) Patent No.: US 11,772,138 B2
(45) Date of Patent: Oct. 3, 2023

(54) PROCESSING APPARATUS AND PROCESSING METHOD, AND GAS CLUSTER GENERATING APPARATUS AND GAS CLUSTER GENERATING METHOD

(71) Applicant: Tokyo Electron Limited, Tokyo (JP)

(72) Inventors: Kazuya Dobashi, Yamanashi (JP); Chishio Koshimizu, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 17/883,997

(22) Filed: Aug. 9, 2022

(65) Prior Publication Data
US 2022/0384152 A1  Dec. 1, 2022

Related U.S. Application Data

(60) Division of application No. 15/715,482, filed on Sep. 26, 2017, now Pat. No. 11,446,714, which is a
(Continued)

(30) Foreign Application Priority Data

Mar. 30, 2015 (JP) ................................. 2015-068867
Sep. 15, 2015 (JP) ................................. 2015-181637

(51) Int. Cl.
*H01L 21/02* (2006.01)
*B08B 7/00* (2006.01)
(Continued)

(52) U.S. Cl.
CPC .............. *B08B 7/0035* (2013.01); *B08B 5/00* (2013.01); *H01J 37/321* (2013.01);
(Continued)

(58) Field of Classification Search
CPC .............. H01J 2237/0812; H01J 37/321; H01J 37/32449; H01J 37/3266; H01J 37/32669;
(Continued)

(56) References Cited

U.S. PATENT DOCUMENTS 4,147,573 A * 4/1979 Morimoto ......... H01L 21/02538
117/106
5,314,540 A * 5/1994 Nakamura ............ C23C 16/276
118/723 R
(Continued)

FOREIGN PATENT DOCUMENTS

JP   S60-124926 A   7/1985
JP   S60-124932 A   7/1985
(Continued)

OTHER PUBLICATIONS

International Search Report dated Mar. 22, 2016 for WO 2016/158054 A1 (4 pages).
(Continued)

*Primary Examiner* — Rudy Zervigon
(74) *Attorney, Agent, or Firm* — Venjuris, P.C.

(57) ABSTRACT

A processing method includes: disposing a workpiece in a processing container of a processing apparatus, and maintaining an inside of the processing container in a vacuum state; providing a cluster nozzle in the processing container; supplying a cluster generating gas to the cluster nozzle and adiabatically expanding the cluster generating gas in the cluster nozzle, thereby generating gas clusters; generating plasma in the cluster nozzle to ionize the gas clusters and injecting the ionized gas clusters onto the workpiece; supplying a reactive gas to the cluster nozzle and exposing the reactive gas to the plasma such that the reactive gas becomes monomer ions or radicals; and supplying the monomer ions or radicals to the processing container, thereby exerting a
(Continued)

chemical reaction on a substance present on a surface of the workpiece.

18 Claims, 17 Drawing Sheets

Related U.S. Application Data continuation of application No. PCT/JP2016/054524, filed on Feb. 17, 2016.

(51) Int. Cl.
  *B08B 5/00* (2006.01)
  *H01J 37/32* (2006.01)
  *H01L 21/311* (2006.01)
  *H01L 21/67* (2006.01)

(52) U.S. Cl.
  CPC .... *H01J 37/3266* (2013.01); *H01J 37/32449* (2013.01); *H01J 37/32669* (2013.01); *H01J 37/32816* (2013.01); *H01L 21/02046* (2013.01); *H01L 21/02057* (2013.01); *H01L 21/31138* (2013.01); *H01L 21/67034* (2013.01); *H01J 37/32651* (2013.01); *H01J 37/32834* (2013.01); *H01J 2237/0473* (2013.01); *H01J 2237/1825* (2013.01); *H01J 2237/335* (2013.01)

(58) Field of Classification Search
  CPC ........... H01J 37/32816; H01J 37/32651; H01J 37/32834; H01J 2237/0473; H01J 2237/1825; H01J 2237/335; H01J 37/3244; H01J 37/32091; B08B 7/0035; B08B 5/00; H01L 21/02046; H01L 21/02057; H01L 21/31138; H01L 21/67034; H01L 21/68764; H01L 21/02274; H01L 21/0262; H01L 21/28556; H01L 21/0234; H01L 21/67051; H01L 21/32136; H05H 1/46; C23C 16/45565; C23C 16/50; C23C 16/45536; C23C 14/35; C23C 16/45574; C23C 16/455; C23C 14/54
  USPC ..... 427/248.1, 533, 534, 535, 569, 570, 906
  See application file for complete search history.

(56) References Cited

U.S. PATENT DOCUMENTS

| | | | | |
|---|---|---|---|---|
| 5,403,399 A * | 4/1995 | Kurihara | ............... | C23C 16/277 219/121.48 |
| 5,728,223 A * | 3/1998 | Murakami | .......... | C23C 16/4557 118/715 |
| 6,213,049 B1 * | 4/2001 | Yang | ..................... | C23C 16/513 219/76.16 |
| 6,325,857 B1 * | 12/2001 | Miyoshi | .............. | C23C 16/4405 118/724 |
| 6,388,381 B2 * | 5/2002 | Anders | .................... | H05H 1/48 219/121.52 |
| 6,539,890 B1 * | 4/2003 | Felts | ........................ | B05D 1/62 118/723 HC |
| 8,945,306 B2 * | 2/2015 | Tsuda | ................ | C23C 16/45544 156/345.33 |
| 9,175,394 B2 * | 11/2015 | Yudovsky | ......... | C23C 16/45504 |
| 10,262,867 B2 * | 4/2019 | Sriraman | .......... | H01L 21/32137 |
| 10,395,900 B2 * | 8/2019 | Kim | .................... | H01J 37/32119 |
| 11,225,708 B2 * | 1/2022 | Kobayashi | .............. | B22F 3/115 |
| 2002/0086106 A1 * | 7/2002 | Park | .................... | C23C 16/45563 427/248.1 |
| 2003/0109092 A1 | 1/2003 | Choi et al. | | |
| 2003/0141178 A1 * | 7/2003 | Shan | ..................... | C23C 16/452 422/186 |
| 2004/0077161 A1 * | 4/2004 | Chen | ................ | H01L 21/76865 438/622 |
| 2006/0096540 A1 * | 5/2006 | Choi | ................ | C23C 16/45578 118/724 |
| 2006/0196420 A1 * | 9/2006 | Ushakov | ............. | H01J 37/3244 118/715 |
| 2006/0219361 A1 * | 10/2006 | Wang | ................ | H01J 37/32357 156/345.33 |
| 2007/0187363 A1 * | 8/2007 | Oka | .................. | H01J 37/32449 156/345.33 |
| 2009/0145361 A1 | 1/2009 | Nakamura et al. | | |
| 2009/0277776 A1 | 11/2009 | Kono et al. | | |
| 2011/0084214 A1 | 4/2011 | Hautala et al. | | |
| 2011/0198417 A1 * | 8/2011 | Detmar | ................ | H01J 37/321 239/589 |
| 2012/0071003 A1 * | 3/2012 | Dobashi | ................ | H01M 4/134 438/758 |
| 2013/0284700 A1 * | 10/2013 | Nangoy | ............ | C23C 16/45578 239/553.3 |
| 2014/0083615 A1 * | 3/2014 | Kim | ..................... | H01J 37/3211 156/345.37 |
| 2016/0001334 A1 | 1/2016 | Dobashi | | |
| 2016/0074887 A1 * | 3/2016 | Kitamura | ................ | H05H 1/42 239/79 |
| 2017/0365444 A1 * | 12/2017 | Kim | ................... | H01J 37/32458 |
| 2019/0300999 A1 * | 10/2019 | Yamaguchi | ............... | C23C 4/02 |
| 2020/0071810 A1 * | 3/2020 | Kobayashi | ................ | C23C 4/06 |
| 2021/0371964 A1 * | 12/2021 | Kobayashi | ............... | C23C 4/129 |

FOREIGN PATENT DOCUMENTS

| | | | | |
|---|---|---|---|---|
| JP | S62-122210 A | 6/1987 | | |
| JP | 04-354865 A | 12/1992 | | |
| JP | 11-293469 A | 10/1999 | | |
| JP | 2008-063590 A | 3/2008 | | |
| JP | 2011-086471 A | 4/2011 | | |
| JP | 2016-027615 A | 2/2016 | | |
| JP | 2016192534 A | * 11/2016 | ............... | B08B 5/00 |
| WO | 2010-021265 A | 2/2010 | | |
| WO | WO-2016158054 A1 | * 10/2016 | ............... | B08B 5/00 |

OTHER PUBLICATIONS

Chapter 3 in Stefano Rampino. PhD Thesis. University of Parma. 2007. pp. 93-126. Available online at: https://www.researchgate.net/publication/273119542_Supersonic_O2_Beam_Assisted_Deposition_of_Long-Length_YBa2Cu3O7_Coated_Conductors. (Year: 2007).
S. Oss et al. "Fast Quasi-Adiabatic Gas Cooling: An Experiment Revisited." European Journal of Physics. 33 (2012). pp. 1155-1165 (Year: 2012).
"Munro's Electron Beam Software [MEBS] Software Brochure." Munro's Electron Beam Software Ltd., London, UK. a4 (2016). pp.1-30. Available online at: http://mebs.co.uk/wp-content/uploads/2016/02/a4-version-MEBS-Brochure-2016.pdf. (Year: 2016).

* cited by examiner

PROCESSING APPARATUS AND PROCESSING METHOD, AND GAS CLUSTER GENERATING APPARATUS AND GAS CLUSTER GENERATING METHOD

CROSS-REFERENCE TO RELATED APPLICATIONS

This application is a Divisional application of U.S. patent application Ser. No. 15/715,482, filed on Sep. 26, 2017, which is a Continuation of International Application No. PCT/JP2016/054524, filed on Feb. 17, 2016 claiming priority from Japanese Patent Application Nos. 2015-068867 and 2016-181637, filed on Mar. 30, 2015 and Sep. 15, 2015, respectively, all of which are incorporated herein in their entireties by reference.

TECHNICAL FIELD

The present disclosure relates to a processing apparatus and method using gas clusters, and a gas cluster generating apparatus and method.

BACKGROUND

Recently, a gas cluster technique for cleaning and processing a workpiece by irradiating gas clusters onto the surface of the workpiece has drawn attention as a technique that enables highly selective processing and cleaning.

When a processing such as cleaning of a surface of a workpiece (e.g., a substrate) is performed using a physical force of the gas clusters, the processing may be insufficient by the physical action of the gas clusters themselves in some cases.

Therefore, as a technique for enhancing the processing capability of cleaning and processing a workpiece by using gas clusters, there has been proposed a technique of generating gas clusters, then ionizing the gas clusters, and causing cluster ion beams accelerated by an electric field or a magnetic field to collide with the workpiece (see, e.g., Japanese Patent Laid-Open Publication Nos. 04-354865 and 2011-086471).

In addition, there is also proposed a technique for improving the throughput by generating gas clusters using a gas having high chemical reactivity without ionizing the gas clusters (International Publication No. WO 2010/021265). In International Publication No. WO 2010/021265, a mixed gas of $ClF_3$ gas, which is a reactive gas, and Ar gas, which is a gas having a boiling point lower than $ClF_3$ gas, is injected into a vacuum processing chamber while adiabatically expanding the mixed gas from an injection unit at a pressure within a range not liquefying, so that reactive clusters are generated, and the reactive clusters are sprayed on a sample in the vacuum processing chamber to perform a processing.

SUMMARY

According to a first aspect, the present disclosure provides a processing apparatus for performing a processing on a workpiece using gas clusters. The apparatus includes a processing container in which the workpiece is disposed, and an inside of which is maintained in a vacuum state; an exhaust mechanism that exhausts an atmosphere in the processing container; a gas supply unit that supplies a gas containing a cluster generating gas for gas cluster generation; a cluster nozzle provided in the processing container and configured to generate gas clusters by adiabatically expanding the cluster generating gas supplied from the gas supply unit therein and inject a gas component containing the generated gas clusters into the processing container; and a plasma generating mechanism that generates plasma in the cluster nozzle portion. The gas clusters are ionized by the plasma generated in the cluster nozzle portion, and the ionized gas clusters are injected from the cluster nozzle and irradiated onto the workpiece, so that a predetermined processing is performed.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
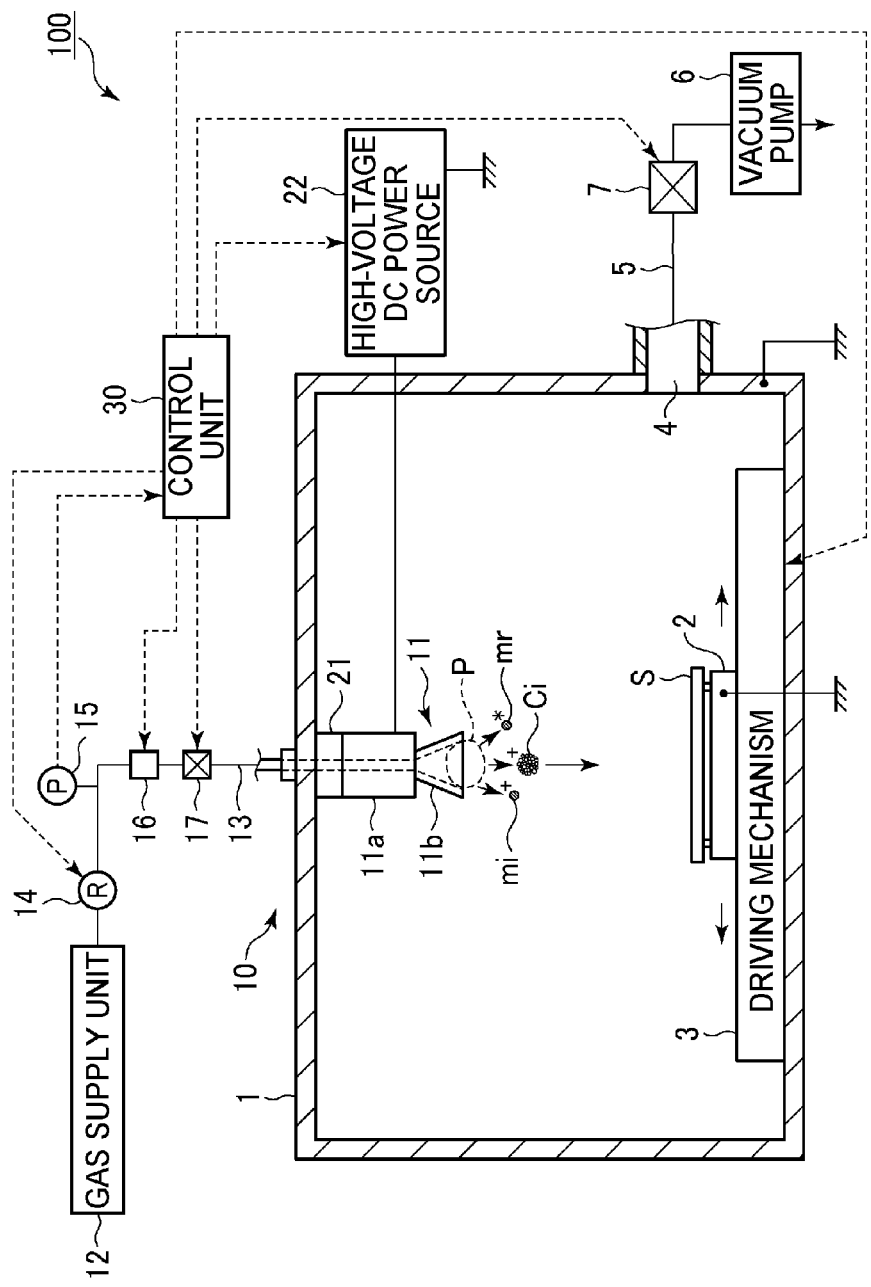
FIG. 1 is a cross-sectional view illustrating a processing apparatus according to a first exemplary embodiment of the present disclosure.

In the following detailed description, reference is made to the accompanying drawing, which form a part hereof. The illustrative embodiments described in the detailed description, drawing, and claims are not meant to be limiting. Other embodiments may be utilized, and other changes may be made, without departing from the spirit or scope of the subject matter presented here.

In the techniques of Japanese Patent Laid-Open Publication Nos. 04-354865 and 2011-086471, the cluster generating unit and the ionization unit are separately provided, so that the configuration of the apparatus becomes complicated and enlarged. In addition, since the ionization unit releases thermal electrons from a filament and causes the thermal electrons to collide with the gas clusters, a vacuum environment of low pressure of about $10^{-3}$ Pa is required. Therefore, the amount of introduced gas is limited, and the amount of generated gas cluster ions is small. Thus, there is a possibility that it takes a long time for a processing such as cleaning.

Further, according to a technique of International Publication No. WO 2010/021265, when a non-reactive substance is present in a workpiece, residues may be generated, so that, for example, cleaning becomes insufficient when a cleaning processing is performed.

Therefore, the present disclosure is to provide a processing method and a processing apparatus using gas clusters, which are capable of performing a processing while suppressing generation of residues, which makes it difficult for the amount of gas clusters to become insufficient without complication and enlargement of the configuration of the apparatus.

According to a first aspect, the present disclosure provides a processing apparatus for performing a processing on a workpiece using gas clusters. The apparatus includes a processing container in which the workpiece is disposed, and an inside of which is maintained in a vacuum state; an exhaust mechanism that exhausts an atmosphere in the processing container; a gas supply unit that supplies a gas containing a cluster generating gas for gas cluster generation; a cluster nozzle provided in the processing container and configured to generate gas clusters by adiabatically expanding the cluster generating gas supplied from the gas supply unit therein and inject a gas component containing the generated gas clusters into the processing container; and a plasma generating mechanism that generates plasma in the cluster nozzle portion. The gas clusters are ionized by the plasma generated in the cluster nozzle portion, and the ionized gas clusters are injected from the cluster nozzle and irradiated onto the workpiece, so that a predetermined processing is performed.

The processing apparatus according to the first aspect may further include an accelerating unit that accelerates the ionized gas clusters injected from the cluster nozzle. Further, the cluster nozzle may be made of a metal, and the plasma generating mechanism may include a DC power source that applies a DC voltage to the cluster nozzle, generates a potential difference the cluster nozzle and the workpiece by the DC power source, and generates the plasma in the cluster nozzle portion by DC discharge. In this case, the DC power source may also function as the accelerating unit by a function of generating a potential difference between the cluster nozzle and the workpiece.

As the plasma generating mechanism, one that generates inductively coupled plasma in the cluster nozzle portion may be used. The cluster nozzle may be made of a dielectric, and the plasma generating mechanism may include an induction coil provided around the cluster nozzle and a high frequency power source that supplies a high frequency power to the induction coil.

In the gas supplied from the gas supply unit, a component not clustered in the cluster nozzle portion may be excited by the plasma to become a monomer ion or a radical, and exert a chemical action on a substance present on a surface of the workpiece.

The gas supply unit may supply the cluster generating gas and a reactive gas, and the reactive gas may be excited by the plasma in the cluster nozzle portion to become a monomer ion or a radical, be supplied to the processing container or directly to the processing container without passing through the cluster nozzle, and exert a chemical action on the substance present on the surface of the workpiece.

The processing apparatus may further include a magnet that generates a magnetic field in a gas injection region of the cluster nozzle. Charged components such as electrons or ions may be trapped in the magnetic field, and a plasma generation region may be defined in a portion where the charged components are trapped. The magnet may be disposed such that a position where a magnetic field intensity of the magnet becomes maximum and a position of an outlet of the cluster nozzle are at the same position, or the outlet of the cluster nozzle is closer to the workpiece than the position where the magnetic field intensity of the magnet becomes maximum.

According to a second aspect, the present disclosure provides a processing method for performing a processing on a workpiece using gas clusters. The method includes disposing the workpiece in a processing container and maintaining an inside of the processing container in a vacuum state; providing a cluster nozzle in the processing container and generating gas clusters by supplying a gas containing a cluster generating gas and adiabatically expanding the gas in the cluster nozzle; generating plasma in the cluster nozzle portion to ionize the gas clusters and injecting the ionized gas clusters from the cluster nozzle; and performing a predetermined processing by irradiating an excited component including the ionized gas clusters onto the workpiece.

The processing apparatus according to the second aspect may further include accelerating the ionized gas clusters injected from the cluster nozzle toward the workpiece. Further, a DC voltage may be applied to the cluster nozzle to generate a potential difference between the cluster nozzle and the workpiece and generate the plasma in the cluster nozzle portion by DC discharge. The plasma generated in the cluster nozzle portion may be inductively coupled plasma.

Particles attached on a surface of the workpiece may be removed by irradiating the ionized gas clusters onto the workpiece.

In the gas supplied from the gas supply unit, a component not clustered in the cluster nozzle portion may be excited by the plasma to become a monomer ion or a radical, and exert a chemical action on the workpiece.

The gas containing the cluster generating gas may include a reactive gas with the cluster generating gas, and the reactive gas may be excited by the plasma in the cluster nozzle portion to become a monomer ion or a radical, be supplied to the processing container or directly to the processing container without passing through the cluster nozzle, and exert a chemical action on the workpiece.

The processing method according to the second aspect may further include generating a magnetic field in a gas injection region of the cluster nozzle by a magnet, trapping charged components such as electrons or ions in the magnetic field, and defining a plasma generation region in a portion where the charged components are trapped. The magnet may be disposed such that a position where a magnetic field intensity of the magnet becomes maximum and a position of an outlet of the cluster nozzle are at the same position, or the outlet of the cluster nozzle is closer to the workpiece than the position where the magnetic field intensity of the magnet becomes maximum.

According to a third aspect, the present disclosure provides an apparatus for generating gas clusters ionized in a processing container that is maintained in a vacuum state. The apparatus includes a gas supply unit that supplies a gas containing a cluster generating gas for gas cluster generation; a cluster nozzle provided in the processing container and configured to generate gas clusters by adiabatically expanding the cluster generating gas supplied from the gas supply unit therein and inject a gas component containing the generated gas clusters into the processing container; and a plasma generating mechanism that generates plasma in the cluster nozzle portion. The gas clusters are ionized by the plasma generated in the cluster nozzle portion, and the ionized gas clusters are injected from the cluster nozzle.

The apparatus may further include a magnet that generates a magnetic field in a gas injection region of the cluster nozzle. Charged components such as electrons or ions are trapped in the magnetic field and a plasma generation region is defined in a portion where the charged components ae trapped.

According to a fourth aspect, the present disclosure provides a method for generating gas clusters ionized in a processing container that is maintained in a vacuum state. The method includes providing a cluster nozzle in the processing container and generating gas clusters by supplying a gas containing a cluster generating gas and adiabatically expanding the gas in the cluster nozzle; and generating plasma in the cluster nozzle portion to ionize the gas clusters and injecting the ionized gas clusters from the cluster nozzle.

The method according to the fourth aspect may further include generating a magnetic field in a gas injection region of the cluster nozzle by a magnet, trapping charged components such as electrons or ions in the magnetic field, and defining a plasma generation region in a portion where the charged components are trapped.

In the present disclosure, gas cluster are generated by adiabatic expansion in the cluster nozzle, and plasma is generated in the cluster nozzle portion by the plasma generating mechanism. Therefore, the formation of gas clusters and the ionization of gas clusters may be both performed in the cluster nozzle. Thus, it is possible to avoid complication and enlargement of the apparatus configuration, it is difficult for the amount of gas clusters to become insufficient, and it is possible to suppress generation of residues as in the case where gas clusters are generated by a reactive gas.

Further, plasma may be generated reliably and stably between the cluster nozzle and the workpiece while suppressing abnormal discharge by providing a magnet that generates a magnetic field in the gas injection region of the cluster nozzle, trapping charged components such as ions or electrons in the magnetic field generated from the magnet, and defining a plasma generating region in a portion where the charged components are trapped.

Hereinafter, exemplary embodiments of the present disclosure will be described with reference to the drawings.

First Exemplary Embodiment

First, a first exemplary embodiment will be described.

FIG. 1 is a cross-sectional view illustrating a processing apparatus according to a first exemplary embodiment of the present disclosure.

A processing apparatus 100 is configured to perform a cleaning processing on a surface of a substrate, which is a workpiece, by irradiating gas clusters onto the surface of the substrate.

The processing apparatus 100 includes a processing container 1 that defines a processing chamber for performing a cleaning processing. A substrate placing table 2 is provided within the processing container 1 to place a substrate S serving as a workpiece thereon. As the substrate S, various substrates such as a semiconductor wafer and a glass substrate for a flat panel display may be exemplified, and there is no particular limitation for the substrates so long as it is necessary to remove adhered particles therefrom. The substrate placing table 2 is driven by a driving mechanism 3.

An exhaust port 4 is provided in the lower portion of the side wall of the processing container 1, and an exhaust pipe 5 is connected to the exhaust port 4. A vacuum pump 6 is provided in the exhaust pipe 5, and the inside of the processing container 1 is evacuated by the vacuum pump 6.

The degree of vacuum at this time may be controlled by a pressure control valve 7 provided in the exhaust pipe 5. These components constitute an exhaust mechanism, and thus, the inside of the processing container 1 is maintained at a predetermined degree of vacuum.

A carry-in/out port (not illustrated) is provided in the lateral side of the processing container 1 to perform a carry-in/out of the processing target substrate S. The processing container 1 is connected to a vacuum conveyance chamber (not illustrated) via the carry-in/out port. The carry-in/out port is able to be opened and closed by a gate valve (not illustrated), and the substrate S is carried into or carried out from the processing container 1 by a substrate conveyance device in the vacuum conveyance chamber.

A gas irradiation mechanism 10 is disposed above the substrate placing table 2 to irradiate gas clusters onto the substrate S. The gas irradiation mechanism 10 includes a cluster nozzle 11 provided in the upper portion of the processing container 1 to face the substrate placing table 2, a gas supply unit 12 provided outside the processing container 1 and configured to supply a gas containing a gas for cluster generation into the cluster nozzle 11, and a gas supply pipe 13 that guides the gas from the supply unit 12 to the cluster nozzle 11. The gas supply pipe 13 is provided with a pressure adjustor 14, a pressure gauge 15, a flow rate controller 16, and an opening/closing valve 17 from the upstream side.

The cluster nozzle 11 is made of a metal and is provided at the center of the top wall of the processing container 1 via an insulator (insulating member) 21. The cluster nozzle 11 has a base end portion 11a and a tip end portion 11b, and is configured as a conical nozzle in which the tip end portion 11b is divergent. A high-voltage DC power source 22 is connected to the base end portion 11a of the cluster nozzle 11 such that a high DC voltage is supplied to the cluster nozzle 11. The cluster nozzle 11 is insulated from the gas supply pipe 13 and the processing container 1 via the insulator 21, and is in an electrically floating state. The processing container 1 and the substrate placing table 2 are grounded. The shape of the nozzle is not limited. In addition, the position of the DC voltage applied to the cluster nozzle 11 is also not limited.

Figure 2:
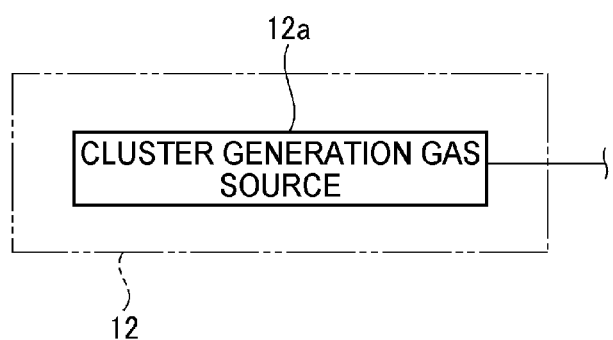
FIG. 2 is a view illustrating an exemplary gas supply unit in the processing apparatus according to the first exemplary embodiment of the present disclosure.
Figure 3:
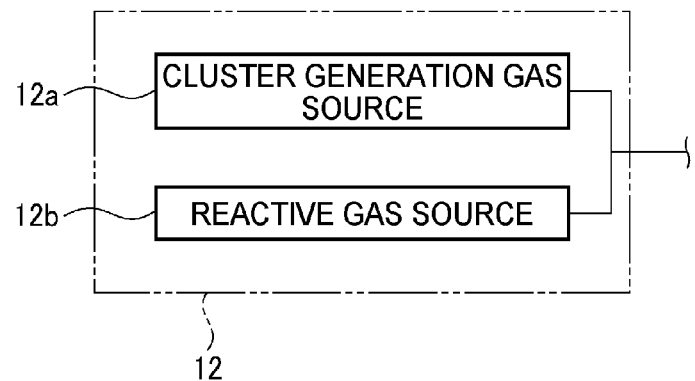
FIG. 3 is a view illustrating another exemplary gas supply unit in the processing apparatus according to the first exemplary embodiment of the present disclosure.
Figure 4:
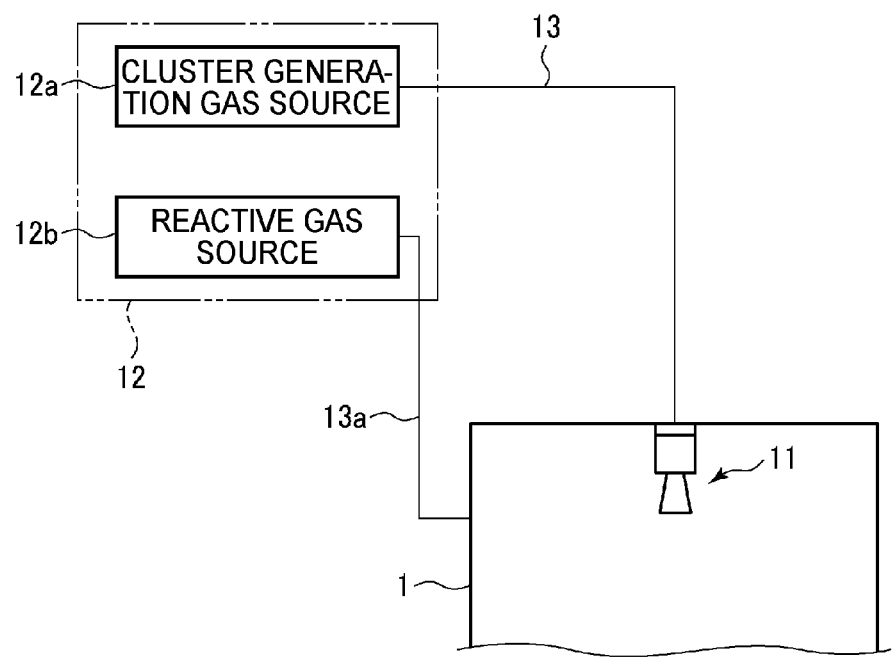
FIG. 4 is a view illustrating still another exemplary gas supply unit in the processing apparatus according to the first exemplary embodiment of the present disclosure.

As illustrated in FIG. 2, the gas supply unit 12 may include only a cluster generation gas source 12a as a gas source. Alternatively, as illustrated in FIG. 3, the gas supply unit 12 may include a cluster generation gas source 12a for supplying cluster generation gas and a reactive gas source 12b for supplying a reactive gas which is excited to function as a reactive species. The gas sources may be connected to the gas supply pipe 13. Further, as illustrated in FIG. 4, the reactive gas source 12b may be connected with a gas supply pipe 13a leading to the processing container 1 such that the reactive gas is directly supplied to the processing container 1 without passing through the cluster nozzle 11.

When a gas containing a cluster generation gas is supplied from the gas supply unit 12, the supply pressure thereof is increased to a high pressure of, for example, about 0.1 to 5 MPa by the pressure adjustor 14 based on the pressure measured by the pressure gauge 15. Since the inside of the processing container 1 is maintained in a vacuum state, the high-pressure cluster generation gas supplied from the gas supply unit 12 adiabatically expands inside the cluster nozzle 11, and a part of atoms or molecules of the gas is agglomerated by a van der Waals force such that several to about $10^7$ atoms or molecules form gas clusters. At this time, since a high DC voltage is applied to the cluster nozzle 11 from the high-voltage DC power source 22 and the substrate S is grounded via the substrate placing table 2, a DC discharge occurs between the cluster nozzle 11 and the substrate S, and plasma P is generated at the tip portion of the cluster nozzle 11. By this plasma P, the gas clusters generated in the cluster nozzle 11 are ionized to become ionized gas clusters Ci, injected from the cluster nozzle 11 into the processing container 1 (processing chamber), accelerated toward the substrate S by the potential difference between the cluster nozzle 11 and the substrate S, and irradiated onto the substrate S. That is, the high-voltage DC power source 22 has both a function as a plasma generation mechanism and a function as an acceleration unit for accelerating ionized gas clusters.

At the same time, non-clustered gas molecules (atoms) flowing in the cluster nozzle 11 are also excited by the plasma P to generate monomer ions mi, and the monomer ions mi are also accelerated by the potential difference between the cluster nozzle 11 and the substrate S and irradiated onto the substrate S. In addition, radicals mr are also generated by the excitation of non-clustered gas molecules (atoms) by the plasma P, and reach the substrate S.

In a case where there is a possibility that the monomer ions mi cause excessive ion damage, a skimmer may be provided such that the monomer ions are not irradiated onto the substrate S. Further, an acceleration electrode may be provided between the cluster nozzle 11 and the substrate S to further accelerate the ionized gas clusters Ci.

The cluster generation gas is not particularly limited, but $CO_2$ gas, Ar gas, $N_2$ gas, $SF_6$ gas, $NF_3$ gas, $C_xH_y$ (hydrocarbon) gas such as $CH_4$ gas, and $C_xF_y$ (fluorocarbon) gas such as $CF_4$ gas may be exemplified. These gases may be applied either individually or as a mixture.

In order to inject the generated gas clusters onto the processing target substrate S without destroying the generated gas clusters, the pressure in the processing container 1 may be set to be low. For example, when the supply pressure of the gas supplied to the cluster nozzle 11 is 0.1 to 5 Mpa, the pressure in the processing container 1 may be 300 Pa or less. However, a low pressure of $10^{-3}$ Pa level as in a technique of ionizing gas clusters by emitting thermal electrons from filaments is not required.

Further, in order to generate plasma in the cluster nozzle 11 portion, the DC voltage supplied from the high-voltage DC power source 22 may be about 0.5 to 20 kV, and the pressure inside the processing container 1 may be 300 Pa or less. Further, when the pressure inside the processing container 1 is 300 Pa or less as described above, the gas clusters may be injected without being destroyed, and plasma may be generated effectively.

The reactive gas is also not particularly limited, but $O_2$ gas and $H_2$ gas may be exemplified. Further, a fluorine-containing gas or $H_2O$ gas, which is inactive in a single gas such as $SF_6$, $CF_4$, or $NF_3$ exemplified as the cluster generation gas, may be used. Further, as described above (see FIG. 4), the gas may be supplied to the processing container 1 via the gas supply pipe 13a without passing through the cluster nozzle 11. In this case, however, the introduced gas may be activated by the excited species in the plasma. The reactive gas is used for removing substances that cannot be removed by the physical force of the ionized clusters.

The driving mechanism 3 moves the substrate placing table 2 in one plane such that the excited components including the ionized gas clusters Ci ejected from the cluster nozzle 11 are irradiated onto the entire surface of the substrate S. The driving mechanism 3 is configured with, for example, an XY table. The driving mechanism 3 may move the cluster nozzle 11 in a plane instead of moving the processing target substrate S via the substrate placing table 2 in this manner. Further, the driving mechanism 3 may move both the substrate placing table 2 and the cluster nozzle 11 in a plane. The substrate placing table 2 may also be rotated to move the cluster nozzle. Further, the substrate placing table 2 may be rotated and moved in parallel.

The processing apparatus 100 includes a control unit 30. The control unit 30 includes a controller having a microprocessor (computer) that controls, for example, the supply of the gas of the processing apparatus 100 (the pressure adjustor 14, the flow rate controller 16, and the opening/closing valve 17), the exhaust of the gas (the pressure control valve 7), the driving of the substrate placing table 2 by the driving mechanism 3, and the voltage of the high-voltage DC power source 22. The controller is connected with, for example, a keyboard through which an operator performs an input operation of a command to manage the processing apparatus 100, a display that visually displays the operation state of the processing apparatus 100. Further, the controller is connected with a storage unit that stores, for example, a processing recipe which is a control program for implementing a processing in the processing apparatus 100 under the control of the controller or a control program for causing each component of the processing apparatus 100 to execute a predetermined processing in accordance with processing conditions, or various databases. The recipe is stored in an appropriate storage medium in the storage unit. Then, if necessary, an arbitrary recipe is called from the storage unit and executed by the controller, so that a desired processing is performed in the processing apparatus 100 under the control of the controller.

Next, descriptions will be made on a processing method using the processing apparatus 100 described above.

First, the gate valve is opened, and the processing target substrate S is carried in through the carry-in/out port and placed on the substrate placing table 2. Then, the inside of the processing container 1 is evacuated by the vacuum pump 6 to be in a vacuum state of a predetermined pressure, and a cluster generation gas such as $CO_2$ gas (or additionally a reactive gas as necessary) is supplied at a predetermined flow rate from the gas supply unit 12. The cluster generation gas is pressure-adjusted by the pressure adjustor 14 and supplied to the cluster nozzle 11 at a predetermined supply pressure. At this time, a booster may be provided in the gas supply unit 12 or between the gas supply unit 12 and the pressure adjustor 14. The high-pressure cluster generation gas supplied from the gas supply unit is adiabatically expanded in the cluster nozzle 11 in a vacuum state, and the cluster generation gas is partially agglomerated to generate gas clusters. At this time, since a high DC voltage is applied to the cluster nozzle 11 from the high-voltage DC power source 22 and the substrate S is grounded via the substrate placing table 2, a DC discharge occurs between the cluster nozzle 11 and the substrate S, and plasma P is generated in the cluster nozzle 11 portion. By this plasma P, the gas clusters generated in the cluster nozzle 11 are ionized to become ionized gas clusters Ci, and the ionized gas clusters Ci are injected from the cluster nozzle 11 into the processing container 1 (processing chamber), accelerated by the potential difference between the cluster nozzle 11 and the substrate S, and irradiated onto the substrate S.

Since the ionized gas clusters Ci can be accelerated by imparting a potential difference, the physical energy of the gas clusters themselves increases. Therefore, since the ionized gas clusters Ci can collide with the substrate S with higher energy than neutral gas clusters, the cleaning effect on the surface of the substrate S can be enhanced.

Figure 5:
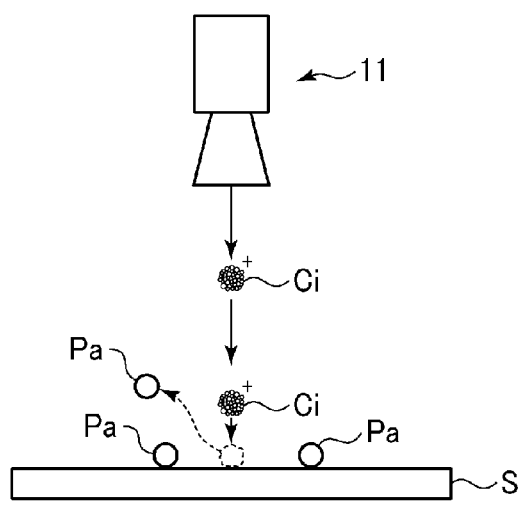
FIG. 5 is a schematic view for explaining a state of removing particles on a substrate by the processing apparatus according to the first exemplary embodiment of the present disclosure.

For example, as illustrated in FIG. 5, when particles Pa are present on the substrate S, the substrate S is irradiated with the ionized gas clusters Ci having a high physical energy. Thus, even though the particles Pa are in a form that is hard to remove, the particles Pa may be effectively removed, so that the removal rate of the particles can be enhanced.

In addition, since both the formation of the gas clusters and the ionization of the gas clusters are performed in the cluster nozzle 11 and in the vicinity of the tip end portion of the cluster nozzle 11, the apparatus does not become large or complicated unlike the apparatuses described in Patent Documents 1 and 2 in which the cluster generation unit and the ionization unit are provided separately. Further, since plasma is generated in the cluster nozzle 11 to ionize the gas clusters, there is no need for a low-pressure environment as in a method of releasing thermal electrons from the filament, and the amount of gas clusters will not become insufficient due to the limitation of the introduced gas amount. Furthermore, since the reactivity of the gas cluster is not utilized by clustering a reactive gas unlike the technique of Patent Document 3, no residue is generated when non-reactive substances are present in the workpiece.

Meanwhile, a cluster generation gas supplied from the gas supply unit 12 is partially clustered. Thus, non-clustered cluster generation gas also flows through the cluster nozzle 11. In addition, even in a case where a substantially non-clustered reactive gas is supplied to the cluster nozzle 11, most of the reactive gas flows through the cluster nozzle 11 as it is. And, the gas molecules (atoms) are also excited by the plasma P in the cluster nozzle 11 portion to become monomer ions mi or radicals mr, and the monomer ions mi and the radicals mr are irradiated onto the substrate S. In addition, in a case where a reactive gas which is easy to be clustered is used as the reactive gas, as illustrated in FIG. 4, the reactive gas is directly supplied into the processing container 1 via the gas supply pipe 13*a*. Then, the reactive gas is activated by the excited species in the plasma to generate monomer ions mi and radicals mr, which are then irradiated onto the substrate S.

The monomer ions mi and radicals mr may effectively act on the processing of the substrate S in the case where substances reacting with the monomer ions and radicals are present on the substrate S. That is, the reactive substance on the substrate S is decomposed (removed) by the excited gas molecules (atoms) (i.e., the monomer ions mi and the radicals mr), and non-reactants and reaction products having a low vapor pressure are removed by the physical force of the ionized gas clusters Ci.

Figure 6A:
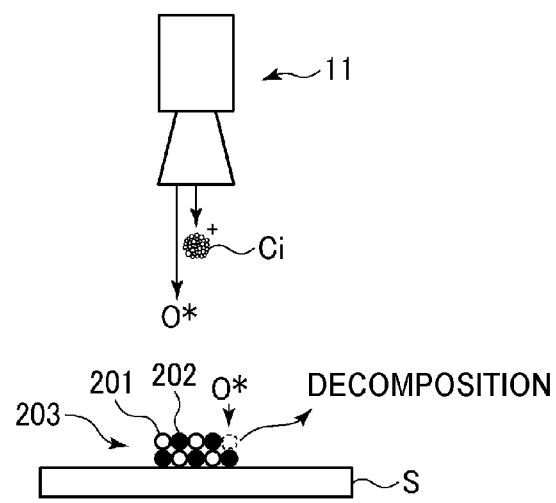
FIG. 6A is a schematic view for explaining a state of removing a composite of an organic material and an inorganic material on a substrate by the processing apparatus according to the first exemplary embodiment of the present disclosure.
Figure 6B:
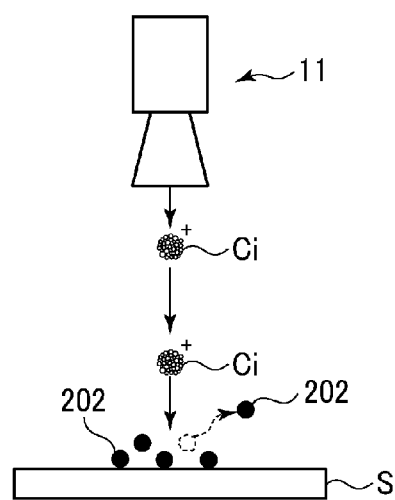
FIG. 6B is a schematic view for explaining a state of removing a composite of an organic material and an inorganic material on a substrate by the processing apparatus according to the first exemplary embodiment of the present disclosure.

For example, when a composite 203 of an organic material 201 (e.g., an EUV resist) and an inorganic material 202 is present on the substrate S, $O_2$ gas is supplied as a reactive gas in addition to a cluster generation gas (e.g., $CO_2$ gas). Then, as illustrated in FIG. 6A, the $O_2$ gas (oxygen radicals (O*)) excited in the cluster nozzle 11 is reacted with the organic material 201 so as to decompose and remove the organic material 201. Then, as illustrated in FIG. 6B, the remaining inorganic material 202 is physically removed with the ionized gas clusters Ci. The reactive gas as used here is not limited to $O_2$ gas, but may be any gas which is reactive to both organic and inorganic materials (e.g., $H_2$ gas).

Figure 7A:
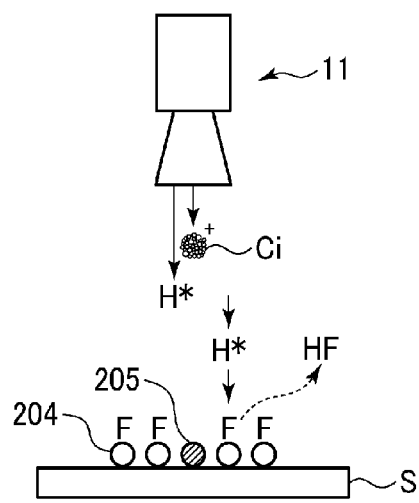
FIG. 7A is a schematic view for explaining a state of removing molecular halogen residues on a substrate by the processing apparatus according to the first exemplary embodiment of the present disclosure.
Figure 7B:
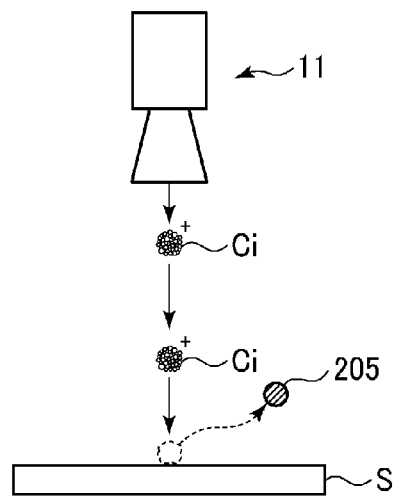
FIG. 7B is a schematic view for explaining a state of removing molecular halogen residues on a substrate by the processing apparatus according to the first exemplary embodiment of the present disclosure.

Further, when halogen-based deposits, for example, molecular halogen residues are present on the substrate S, $H_2$ gas is supplied as a reactive gas in addition to the cluster generation gas (e.g., $CO_2$ gas). Then, as illustrated in FIG. 7A, the $H_2$ gas (hydrogen radical (H*)) excited in the cluster nozzle 11 is reacted with the molecular halogen residues 204, which are in turn converted into volatile components (e.g., HF) and removed. Then, as illustrated in FIG. 7B, the other nonvolatile components (particulates) 205 are removed by the physical force of the ionized gas clusters Ci. The reactive gas as used here is not limited to $H_2$ gas, but may be a gas which is reactive to halogen residues (e.g., $H_2O$ gas).

Figure 8A:
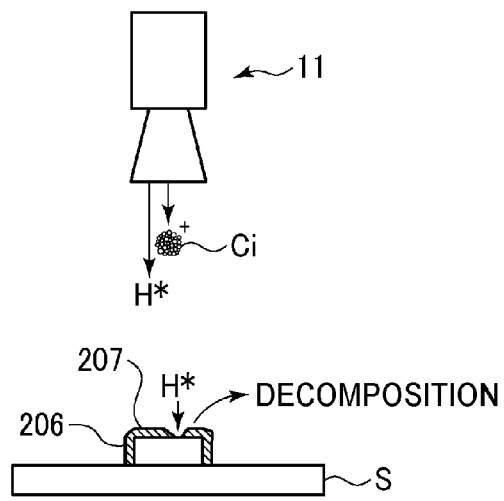
FIG. 8A is a schematic view for explaining a state of removing a resist layer after high dose ion implantation on a substrate by the processing apparatus according to the first exemplary embodiment of the present disclosure.
Figure 8B:
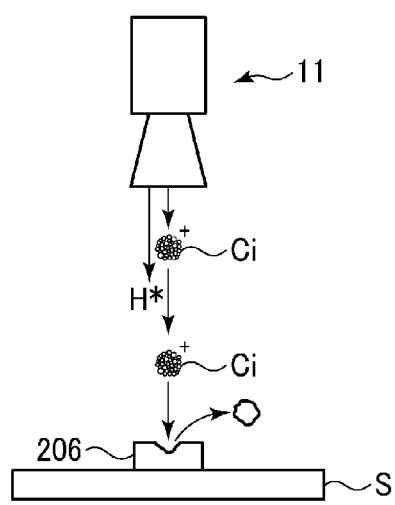
FIG. 8B is a schematic view for explaining a state of removing a resist layer after high dose ion implantation on a substrate by the processing apparatus according to the first exemplary embodiment of the present disclosure.

Further, although a crust layer (rigid carbon layer) is formed on the surface of the resist layer after high dose ion implantation, in the case of removing the resist layer after high dose ion implantation on the substrate S, similarly, $H_2$ gas is supplied as a reactive gas in addition to the cluster generation gas. Then, as illustrated in FIG. 8A, the hydrogen radicals (H*) are reacted with the crust layer 207, which is in turn decomposed and removed. Then, as illustrated in FIG. 8B, the remaining ordinary resist layer 206 may be removed with high efficiency by a combination of decomposition by the hydrogen radicals and physical force of the ionized gas clusters Ci. The reactive gas as used here is not limited to $H_2$ gas, but may be any gas which is reactive to organic materials (e.g., $O_2$ gas).

By using a gas that has reactivity when excited (e.g., $NF_3$ gas) as the cluster generation gas, it is possible to cause both the physical force of the ionized gas clusters and the chemical reaction of the excited molecules to act on the substance on the substrate S with the cluster generation gas only.

In a case where the monomer ions mi may cause excessive ion damage, a skimmer may be provided to reduce the irradiation of the monomer ions mi onto the substrate S. In a case where the ion removal is insufficient even with the use of the skimmer, the neutralizer may be used to directly neutralize the monomer ions mi which may cause ion damage.

In addition, by providing an acceleration electrode between the cluster nozzle 11 and the substrate S, the ionized gas clusters Ci are further accelerated, so that the physical force of the ionized gas clusters Ci may be increased.

Figure 9:
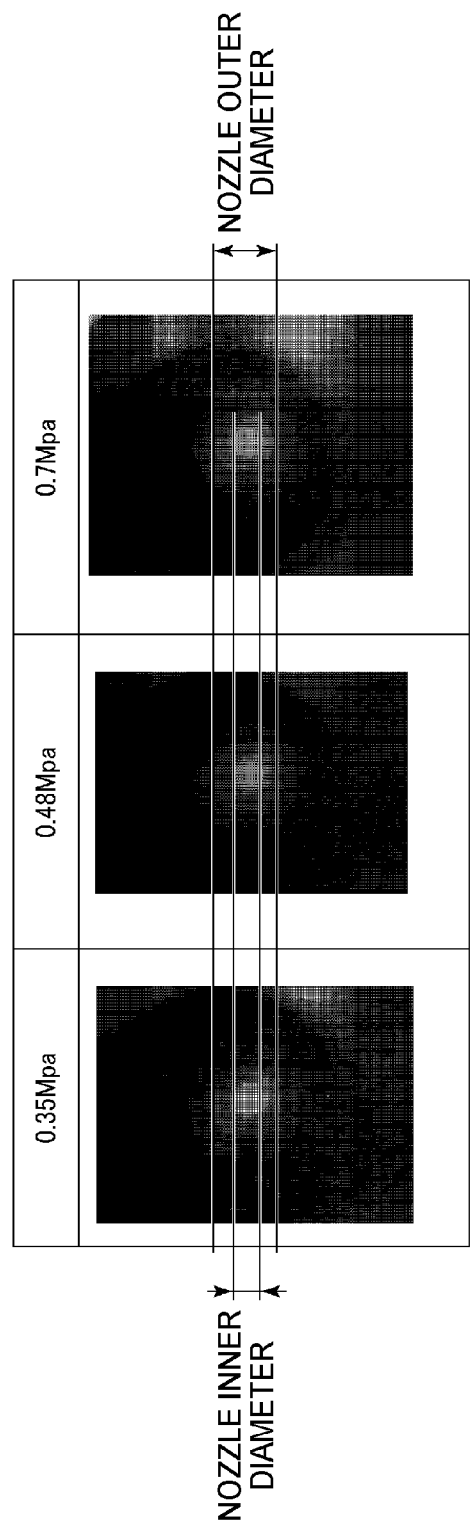
FIG. 9 is a view illustrating a situation when viewed from the lower side of the cluster nozzle at the time of actually performing DC discharge in a cluster nozzle.
Figure 10:
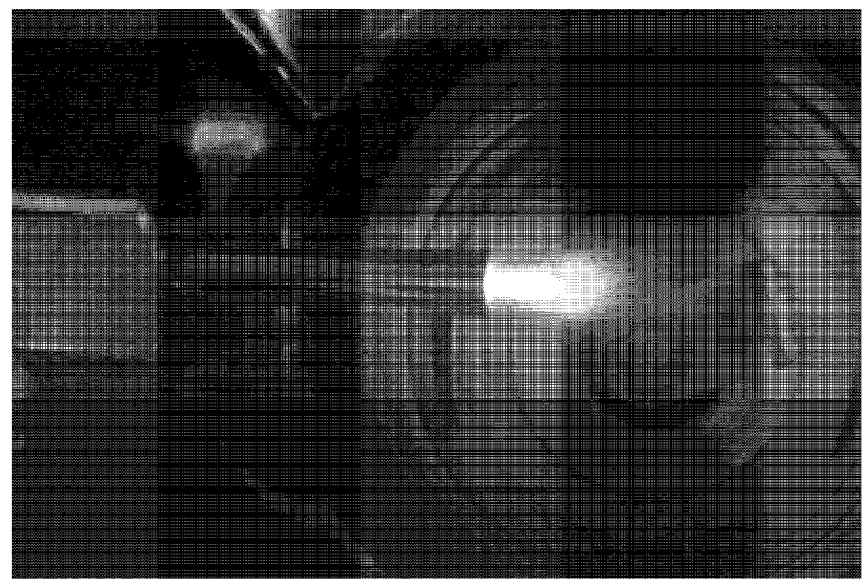
FIG. 10 is a view illustrating a situation when viewed from a side of the cluster nozzle at the time of actually performing DC discharge in a cluster nozzle.

Next, descriptions will be made on a situation at the time of actually performing DC discharge in the cluster nozzle 11. FIG. 9 is a view illustrating a discharge situation when viewed from the lower side of the cluster nozzle in the case where $CO_2$ gas is used as the cluster generation gas and the pressure of the $CO_2$ gas is changed. Here, the pressure inside the processing container was set to 0.8 Pa or less, the voltage applied from the high-voltage DC power source was set to 5 kV at maximum, and the $CO_2$ gas supply pressure was changed to 0.35 MPa, 0.48 MPa, and 0.7 MPa. As illustrated in FIG. 9, when the supply pressure increased, the luminance of the plasma generation portion (bright portion) increased, the size of the plasma generation portion also increased, and the plasma generation portion became larger than the inner diameter of the nozzle to expand to the outer diameter side of the nozzle. Since the flow rate of the $CO_2$ gas passing through the cluster nozzle increases by the increase of the supply pressure, the result in FIG. 9 indicates that the brightness of the plasma generation portion (bright portion) increases and the size of the plasma generation portion also increases by the increase of the $CO_2$ gas flow rate. In addition, the plasma generation portion becomes larger than the inner diameter of the nozzle to expand to the outer diameter side, which suggests that plasma is also generated near the outlet of the cluster nozzle. FIG. 10 is a view illustrating a situation as viewed from the side of the cluster nozzle at the time of actually performing a DC discharge in the cluster nozzle under the condition of the supply pressure of 0.48 MPa, but it can be seen that the plasma spreads from the tip portion of the cluster nozzle to the outlet side. In addition, under a condition in which the supply power of the DC power source is constant, when the supply gas flow rate increases, the current value increases accordingly. In this regard, it is assumed that the ionized components in the plasma have increased due to the increase in the $CO_2$ gas flow rate, and thus, the current value has increased.

Figure 11:
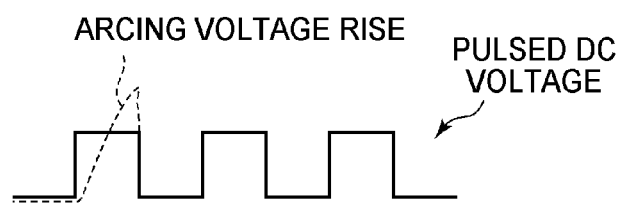
FIG. 11 is a view illustrating an example in which a DC voltage used for plasma generation is pulsed.

The high-voltage DC power source 22 used for plasma generation may continuously apply a DC voltage, but may apply a DC voltage in a pulsed form as illustrated in FIG. 11. By applying a DC voltage in a pulsed form, it is possible to suppress occurrence of abnormal discharge by canceling the increase in arcing voltage at the time of voltage application. In addition, when the DC voltage is continuously applied, it is assumed that the plasma state becomes excessive and cluster formation is hindered. However, when the DC voltage is applied in a pulsed form, gas clusters may be highly efficiently generated.

Figure 12:
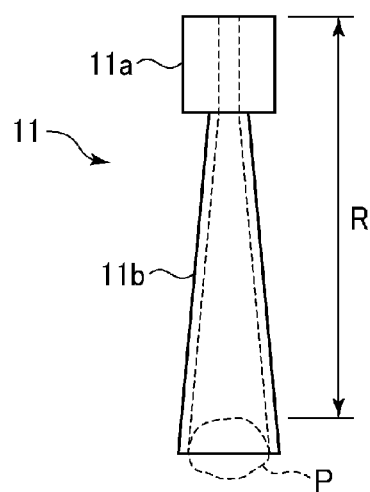
FIG. 12 is a view illustrating a preferred form of the cluster nozzle in the processing apparatus according to the first exemplary embodiment of the present disclosure.

Further, as illustrated in FIG. 12, the shape of the cluster nozzle 11 may be lengthened so as to expand the cluster generation region. When the DC voltage is applied to the cluster nozzle 11 so as to perform DC discharge, plasma is generated near the outlet of the tip of the cluster nozzle 11. Therefore, by increasing the length of the cluster nozzle 11, the distance of a cluster generation region R from the inlet of the cluster nozzle 11 to the plasma generation region may be made sufficiently long so as to generate the gas clusters. As a result, it is possible to increase the amount of gas cluster generation.

Figure 13:
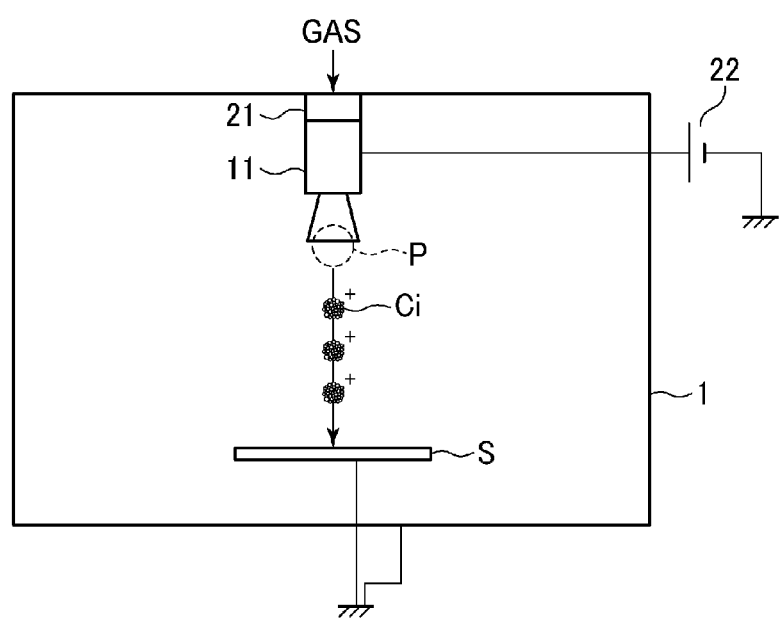
FIG. 13 is a schematic view for explaining a ground form in the processing apparatus according to the first exemplary embodiment of the present disclosure.
Figure 14:
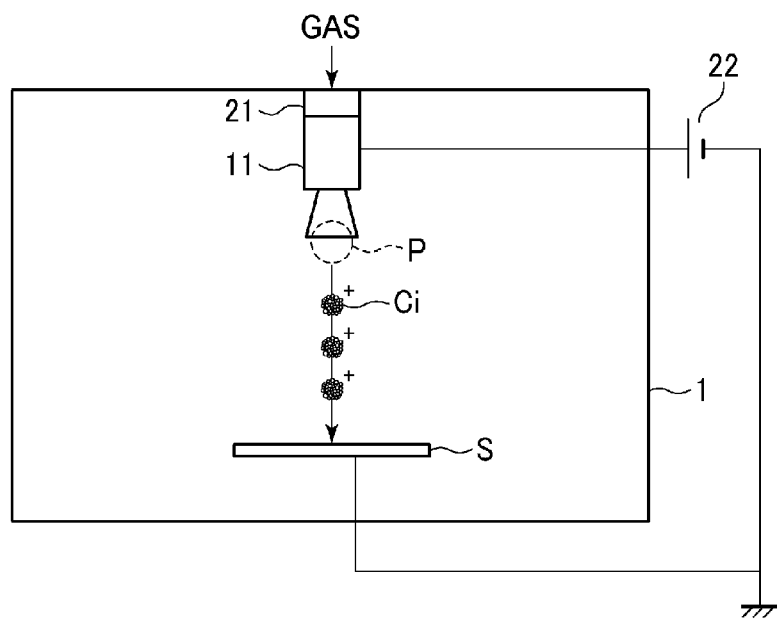
FIG. 14 is a schematic view for explaining another exemplary ground form.

The example of FIG. 1 takes a simple configuration in which the substrate S and the processing container 1 are both grounded, so that, as illustrated in FIG. 13, a potential difference is formed between the substrate S and the processing container 1, and the cluster nozzle 11. However, as illustrated in FIG. 14, only the substrate S may be grounded. In that case, it is possible to separate the potential of the substrate and the potential of the peripheral components of the processing container 1, except for the substrate S.

Second Exemplary Embodiment

Next, a second exemplary embodiment will be described.

Figure 15:
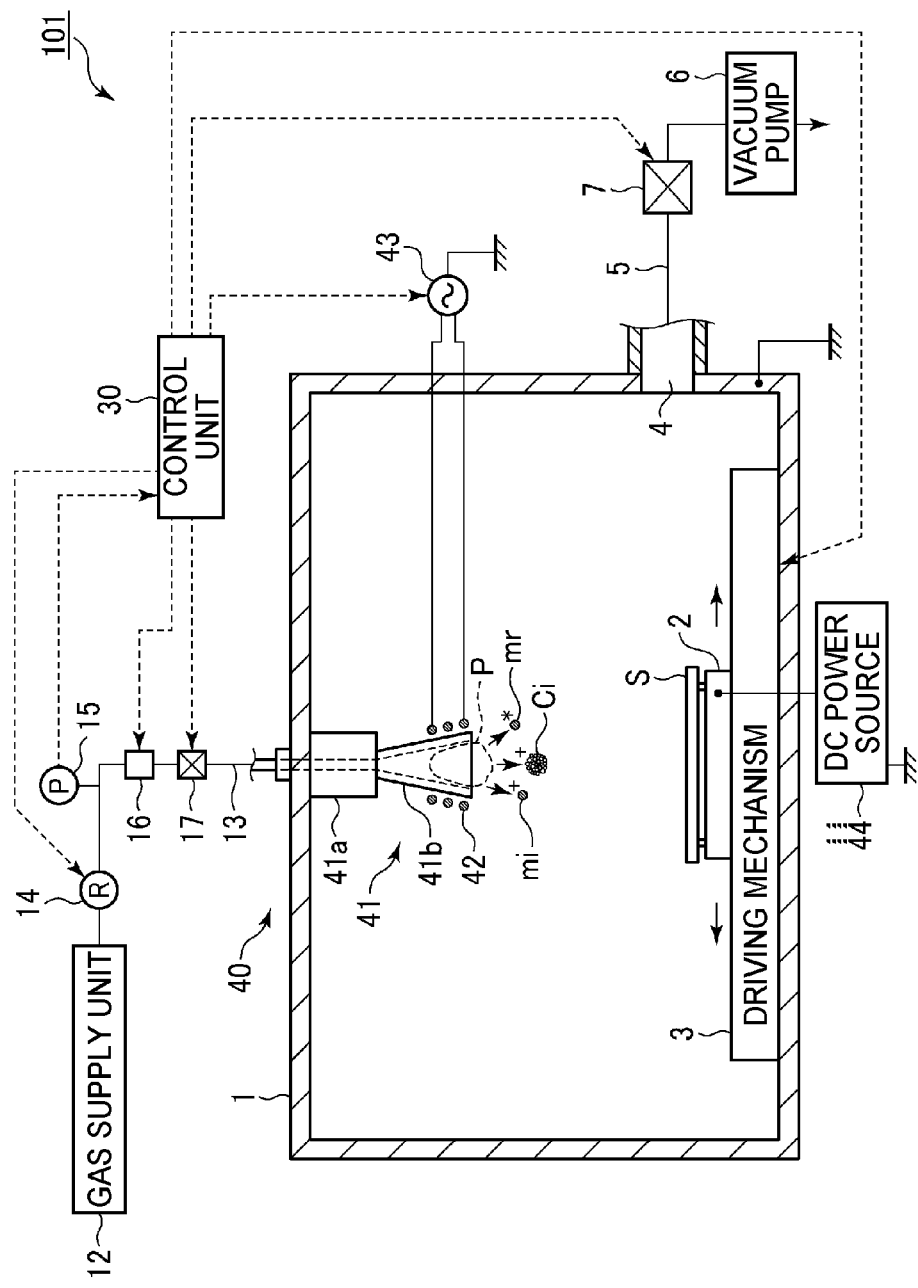
FIG. 15 is a cross-sectional view illustrating a processing apparatus according to a second exemplary embodiment of the present disclosure.

FIG. 15 is a cross-sectional view illustrating a processing apparatus according to a second exemplary embodiment of the present disclosure.

A processing apparatus 101 of the present exemplary embodiment includes a gas cluster irradiating mechanism 40 in which a cluster nozzle 41 is provided in place of the cluster nozzle 11 of the first exemplary embodiment, and the plasma generating method is changed to an inductively coupled plasma (ICP) method.

The cluster nozzle 41 is made of a dielectric material such as quartz or ceramics (e.g., alumina), has a base end portion 41a and a tip end portion 41b, and is configured as a conical nozzle in which the base end portion 41a is attached to the center of the top wall of the processing container 1, and the tip end portion 41b is divergent. An induction coil 42 is wound around the tip end portion 41b of the cluster nozzle 41, and a high-frequency power source 43 is connected to the induction coil 42. However, the shape of the nozzle is not limited. Further, a DC power source 44 is connected to the substrate placing table 2. Since the other configuration is the same as that of the processing apparatus 100 of FIG. 1, the detailed description thereof will be omitted.

Similarly to the first exemplary embodiment, when a gas containing a cluster generation gas is supplied from the gas supply unit 12, the supply pressure thereof is increased to a high pressure of, for example, about 0.1 to 5 MPa by the pressure adjustor 14 based on the pressure measured by the pressure gauge 15. Since the inside of the processing container 1 is maintained in a vacuum state, the high-pressure cluster generation gas supplied from the gas supply unit 12 adiabatically expands inside the cluster nozzle 41, so that gas clusters are formed. In this case, when a high-frequency power is supplied from the high-frequency power source 43 to the induction coil 42 wound around the tip end portion 41b of the cluster nozzle 41, an induced electromagnetic field is generated in the portion inside the cluster nozzle 41 around which the induction coil 42 is wound, so that plasma P is generated in the cluster nozzle 41 portion. By this plasma P, the gas clusters generated in the cluster nozzle 41 are ionized to become ionized gas clusters Ci, and injected from the cluster nozzle 41 into the processing container 1 (processing chamber). Meanwhile, since the DC power source 44 is connected to the substrate placing table 2, a potential difference is generated between the cluster nozzle 41 and the substrate S, and the potential difference causes the ionized gas clusters Ci to be accelerated and irradiated onto the substrate S. That is, the DC power source 44 functions as an acceleration unit that accelerates the ionized gas clusters.

Non-clustered gas molecules (atoms) flowing in the cluster nozzle 41 are also excited by the plasma P to generate monomer ions mi, and the monomer ions mi are also accelerated by the potential difference between the cluster nozzle 41 and the substrate S and irradiated onto the substrate S. In addition, radicals mr are also generated by the excitation of non-clustered gas molecules (atoms) by the plasma P, and reach the substrate S.

Similarly to the first exemplary embodiment, the cluster generation gas is not particularly limited, but examples thereof include $CO_2$ gas, Ar gas, $N_2$ gas, $SF_6$ gas, $CF_4$ gas, and $NF_3$ gas, which may be used either alone or in mixture. In addition, similarly to the first exemplary embodiment, the pressure in the processing container 1 may be low, and preferably 300 Pa or less, for example, when the supply pressure of the gas supplied to the cluster nozzle 11 is 0.1 to 5 MPa. However, it is unnecessary to be a low pressure of $10^{-3}$ Pa level as in a technique of ionizing gas clusters by emitting thermal electrons from filaments. Similarly to the first exemplary embodiment, the reactive gas is also not particularly limited, but examples thereof include $O_2$ gas and $H_2$ gas. The reactive gas is used for removing substances that cannot be removed by a physical force of the ionized clusters.

In order to generate inductively coupled plasma in the cluster nozzle 11 portion, the frequency of the high-frequency power source 43 may be about 1 to 300 MHz, the power may be about 1 to 1,000 W, and the pressure inside the processing container may be about 0.01 to 300 Pa Further, when the pressure inside the processing container 1 is 300 Pa or less as described above, the gas clusters may be injected without being destroyed, and plasma may be generated effectively.

Also in the processing apparatus 101 of the present disclosure, first, the gate valve is opened, and the processing target substrate S is carried in through the carry-in/out port and placed on the substrate placing table 2. Then, the inside of the processing container 1 is evacuated by the vacuum pump 6 to be in a vacuum state of a predetermined pressure, and a cluster generation gas (e.g., $CO_2$ gas) and additionally a reactive gas as necessary at a predetermined flow rate from the gas supply unit 12. The cluster generation gas is increased in pressure by the pressure adjustor 14 and supplied to the cluster nozzle 41 at a predetermined supply pressure. The high-pressure cluster generation gas is adiabatically expanded in the cluster nozzle 41 in a vacuum state, and a part thereof is agglomerated to generate gas clusters. At this time, the high-frequency power is supplied from the high-frequency power source 43 to the induction coil 42 in the cluster nozzle 41 portion, so that the inductively coupled plasma P is generated. By this plasma P, the gas clusters generated in the cluster nozzle 41 are ionized to become ionized gas clusters Ci, injected from the cluster nozzle 41 into the processing container 1 (processing chamber), accelerated by the potential difference between the cluster nozzle 41 and the substrate S, which is caused by the DC voltage applied from the DC power source 44, and irradiated onto the substrate S.

Similarly to the first exemplary embodiment, in the present exemplary embodiment, the ionized gas clusters Ci are accelerated by the potential difference so that the physical energy of the gas clusters themselves increases. Thus, since the ionized gas clusters Ci may collide with the substrate S with higher energy than neutral gas clusters, the cleaning effect on the surface of the substrate S may be enhanced. Therefore even if particles Pa which are difficult to remove are present on the substrate S, it is possible to effectively remove the particles Pa. Further, similarly to the first exemplary embodiment, problems as in the techniques of Patent Documents 1, 2, and 3 do not arise.

Meanwhile, similarly to the first exemplary embodiment, a non-clustered cluster generation gas also flows through the cluster nozzle 41. Further, in a case of supplying a reactive gas, the gas to be used is substantially non-clustered. Thus, most of the reactive gas flows through the cluster nozzle 41 as it is. And, the gas molecules (atoms) are also excited by the plasma P in the cluster nozzle 41 portion to become monomer ions mi or radicals mr, and the monomer ions mi and the radicals mr are irradiated onto the substrate S.

Similarly to the first exemplary embodiment, the monomer ions mi and radicals mr may effectively act on the processing of the substrate S in the case where substances reacting with them are present on the substrate S. That is, the reactive substance on the substrate S is decomposed (removed) by the excited gas molecules (atoms) (i.e., the monomer ions mi and the radicals mr), and non-reactants and reaction products having a low vapor pressure are removed by the physical force of the ionized gas clusters Ci. Therefore, the applications illustrated in FIGS. 5 to 8B as exemplified in the first exemplary embodiment may also be applied to the present exemplary embodiment.

Also in the present exemplary embodiment, in a case where the monomer ions mi may cause excessive ion damage on the substrate S, a skimmer may be provided to reduce the irradiation of the monomer ions mi onto the substrate S. In a case where the ion removal is insufficient even with the use of the skimmer, the neutralizer may be used to directly neutralize the monomer ions mi which may cause ion damage. Further, instead of applying a DC voltage to the substrate S by connecting the DC power source 44 to the substrate placing table 2, or in addition to applying a DC voltage, an acceleration electrode may be provided between the cluster nozzle 41 and the substrate S to further accelerate the ionized gas clusters Ci.

Figure 16:
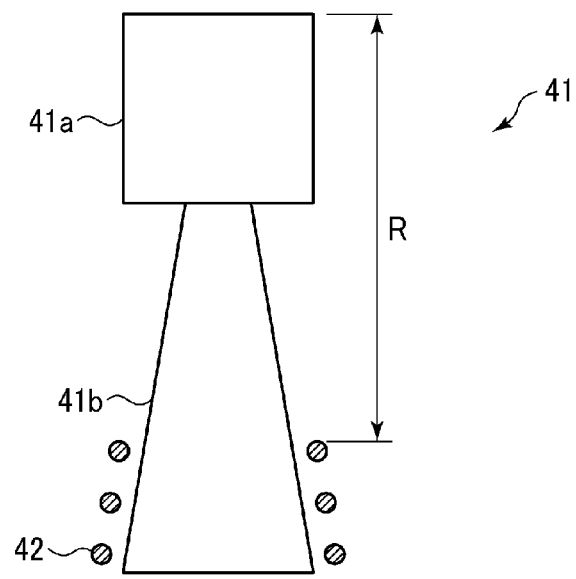
FIG. 16 is a view illustrating a preferred form of a cluster nozzle in the processing apparatus according to the second exemplary embodiment of the present disclosure.

As illustrated in FIG. 16, the cluster nozzle 41 of the present exemplary embodiment may also expand the cluster generation region by lengthening the shape like the cluster nozzle 11 of the first exemplary embodiment. That is, since the inductively coupled plasma is formed in the region around which the induction coil 42 is wound, the generation amount of the gas clusters may be increased by winding the induction coil 42 around the tip end portion of the cluster nozzle 41, and setting the cluster generation region R between the inlet of the cluster nozzle 41 and the region around which the induction coil 42 is wound to a length long enough to generate a gas clusters.

Figure 17:
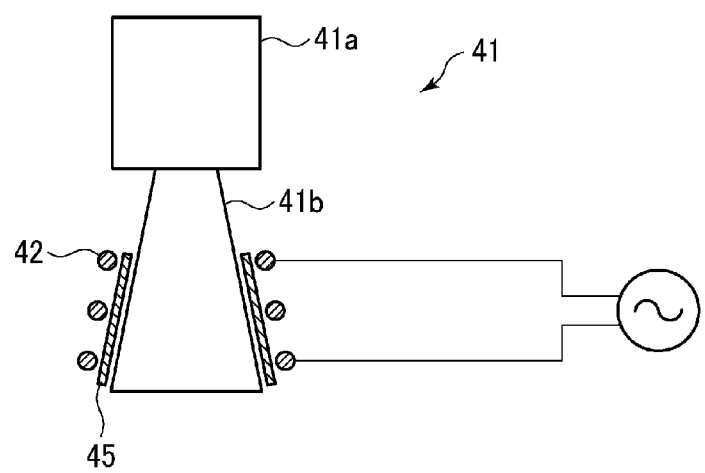
FIG. 17 is a schematic view illustrating an example in which a Faraday shield is provided between a cluster nozzle and an induction coil in the processing apparatus according to the second exemplary embodiment of the present disclosure.
Figure 18:
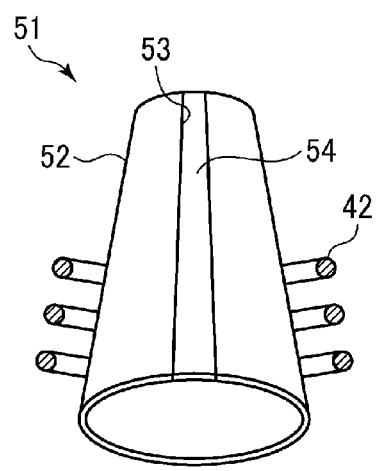
FIG. 18 is a perspective view illustrating an example in which a cluster nozzle and a Faraday shield are integrated.

As illustrated in FIG. 17, a metallic conical Faraday shield 45 may be provided between the induction coil 42 and the tip end portion 41b of the cluster nozzle 41 from the viewpoint of suppressing electrical damage to the inner wall of the cluster nozzle 41. As illustrated in FIG. 18, a Faraday shield integral type cluster nozzle 51 may be provided in place of the cluster nozzle 41. The cluster nozzle 51 is insulated by providing a slit 53 in a nozzle body 52 also serving as a Faraday shield, and providing a dielectric 54 (e.g., quartz) to fill the inside of the slit 53.

Third Exemplary Embodiment

Next, a third exemplary embodiment will be described.

Figure 19:
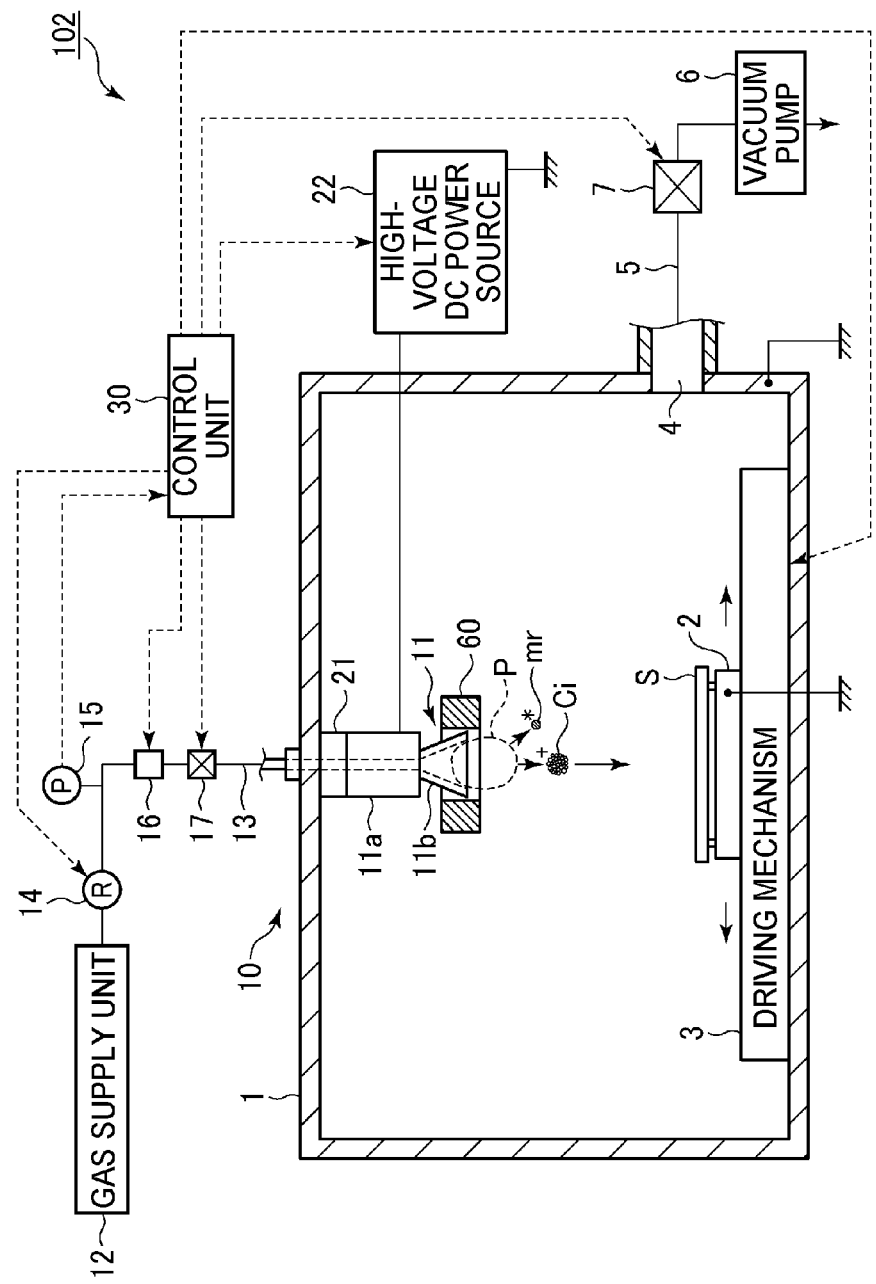
FIG. 19 is a cross-sectional view illustrating a processing apparatus according to a third exemplary embodiment of the present disclosure.

FIG. 19 is a cross-sectional view illustrating a processing apparatus according to a third exemplary embodiment of the present disclosure.

The processing apparatus 102 of the present exemplary embodiment is configured by adding a magnet 60 to the processing apparatus of the first exemplary embodiment. Since other parts are the same as those of the first exemplary embodiment, descriptions thereof will be omitted.

The magnet 60 generates a magnetic field in the gas injection region of the cluster nozzle 11. The magnet 60 traps charged components such as electrons or ions by the generated magnetic field and defines a plasma generation region in a portion where the charged components are trapped. The magnet 60 is made of a permanent magnet such as, for example, a samarium cobalt magnet.

Figure 20:
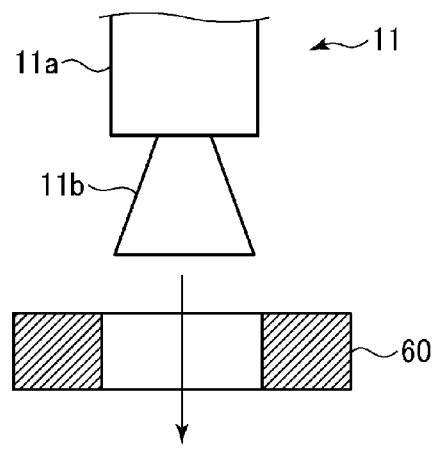
FIG. 20 is a view illustrating another exemplary arrangement position of a magnet.

In this example, the magnet 60 has a ring shape and is provided to surround the cluster nozzle 11. However, the arrangement position of the magnet 60 is not limited so long as a magnetic field is generated in the gas injection region of the cluster nozzle 11, charged components such as ions and electrons are trapped by the generated magnetic field, and the plasma generation region is defined in the trapped portion. The magnet 60 may be provided to surround the gas component injection region from the cluster nozzle 11 as illustrated in FIG. 20.

A high DC voltage is supplied from the high-voltage DC power source 20 to the cluster nozzle 11, and the substrate S serving as the workpiece is grounded. Thus, when the pressure inside the processing container 1 is low, even though the magnet 60 is not provided, DC discharge is generated between the nozzle 11 and the substrate S, and plasma is generated at the tip end portion of the gas cluster nozzle 11. However, when the pressure inside the processing container 1 rises due to the gas supplied from the cluster nozzle 11, and when the magnet 60 is not present, abnormal discharge may occur between the cluster nozzle 11 and, for example, the wall portion of the processing container 1. In this case, it is difficult to continuously generate plasma between the cluster nozzle 11 and the substrate S.

On the other hand, by providing the magnet 60, the charged components generated by being excited by the high-voltage DC power source in the gas ejected from the cluster nozzle 11, that is, ions and electrons are trapped by the magnetic field generated from the magnet. Thus, the density of the ions and electrons increases in the portion where the ions and electrons are trapped. Therefore, it is possible to reliably and stably define the plasma generation region in that portion. Accordingly, even when the pressure in the processing container rises, the plasma may be continuously maintained in the cluster nozzle 11 portion.

Figure 21:
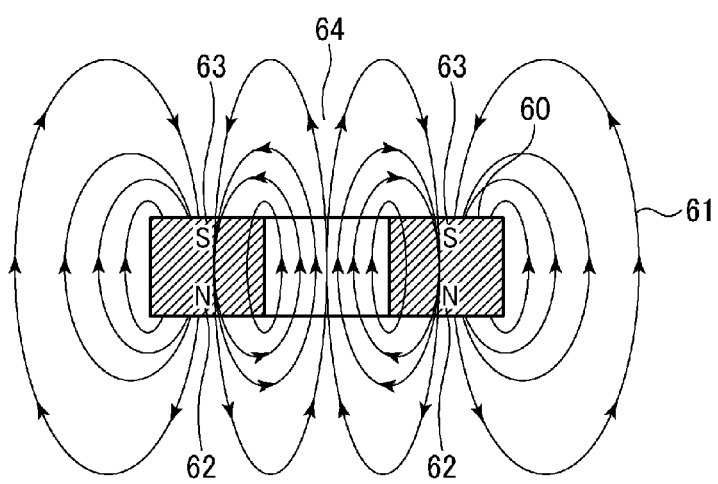
FIG. 21 is a view illustrating magnetic force lines generated from a magnet.

As illustrated in FIG. 21, the magnetic field generated from the magnet 60 may be represented by magnetic force lines 61. The magnetic force lines 61 are curved lines from an N pole 62 to an S pole 63 of the magnet, and as the density of the magnetic force lines increases, the strength of the magnetic field increases. Charged components such as ions and electrons are rotated around the magnetic force lines 61 and are thus trapped by the magnetic field.

Figure 22:
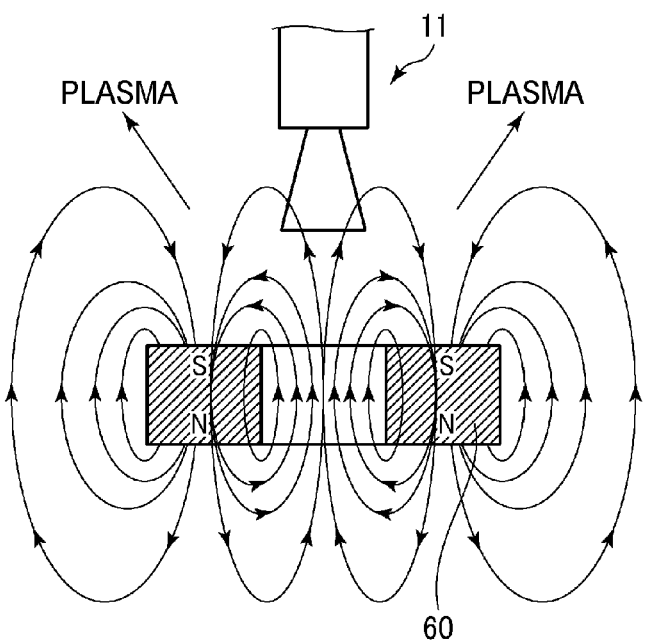
FIG. 22 is a view for explaining a mirror effect generated when the magnet is provided at a position away from the cluster nozzle toward the substrate side.
Figure 23:
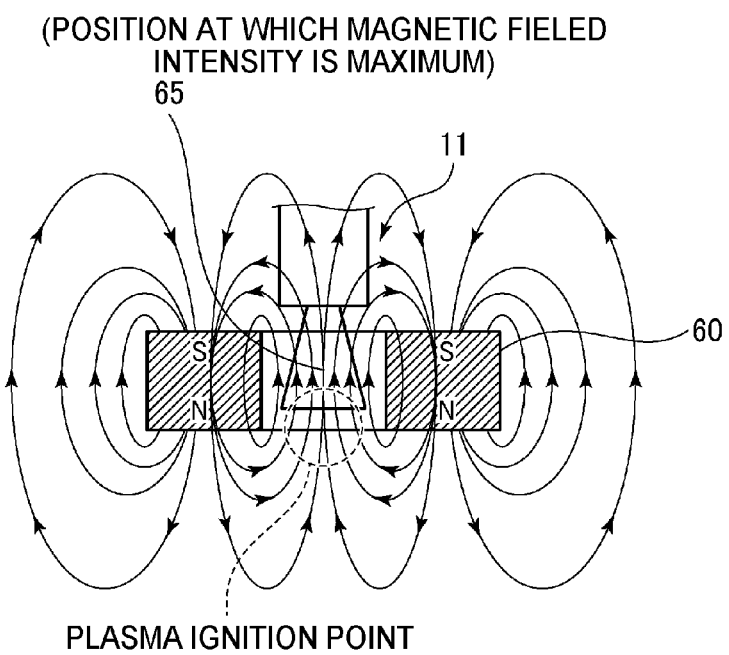
FIG. 23 is a view illustrating an arrangement of a magnet capable of igniting plasma in the vicinity of an outlet of the magnet while suppressing a mirror effect.

When the charged components approach a funnel-shaped region 64 where the magnetic force lines 61 converge, the charged components may be repulsed and the plasma may be bounced back. This is called a mirror effect. Specifically, in the case where the magnet 60 is provided at a position away from the cluster nozzle 11 toward the substrate S as illustrated in FIG. 20, the plasma may be bounced to the upper side of the cluster nozzle 11 by the mirror effect, as illustrated in FIG. 22. On the other hand, as illustrated in FIG. 23, when the magnet 60 is positioned such that the position of the outlet of the cluster nozzle 11 is the same as a position 65 at which the magnetic field intensity becomes maximum, or such that the outlet of the cluster nozzle 11 becomes closer to the workpiece side than the position 65 at which the magnetic field intensity becomes maximum, it is considered that plasma may be generated in the vicinity of the outlet of the magnet 60 while suppressing the rebound of the plasma due to the mirror effect.

Figure 24:
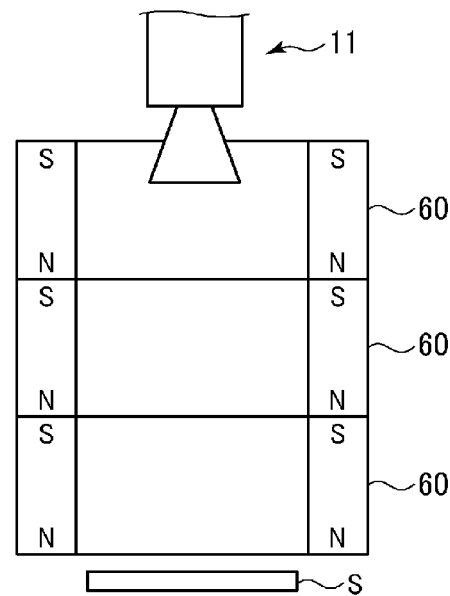
FIG. 24 is a view illustrating an example in which a plurality of magnets are installed in series from the cluster nozzle side toward the substrate side.

It is desirable that the magnet 60 maintains the plasma at the cluster nozzle 11 portion continuously and has an effect of guiding the plasma to the substrate S. For that purpose, the length in the vertical direction of the magnet 60 may be long. Further, from that viewpoint, a plurality of magnets 60 may be provided in series from the cluster nozzle 11 side toward the substrate S side, as illustrated in FIG. 24. By arranging the plurality of magnets 60 in series in this manner, it is possible to form the magnetic field from the outlet portion of the cluster nozzle 11 to the vicinity of the substrate S without interruption of the magnetic field. Thus, the plasma may be guided from the cluster nozzle 11 portion to the substrate S side. At this time, when the gap between the adjacent magnets 60 is too large, the mirror effect may occur, and the effect of confining the plasma may be reduced. Therefore, it is desirable to minimize the gap between the adjacent magnets 60.

Figure 25:
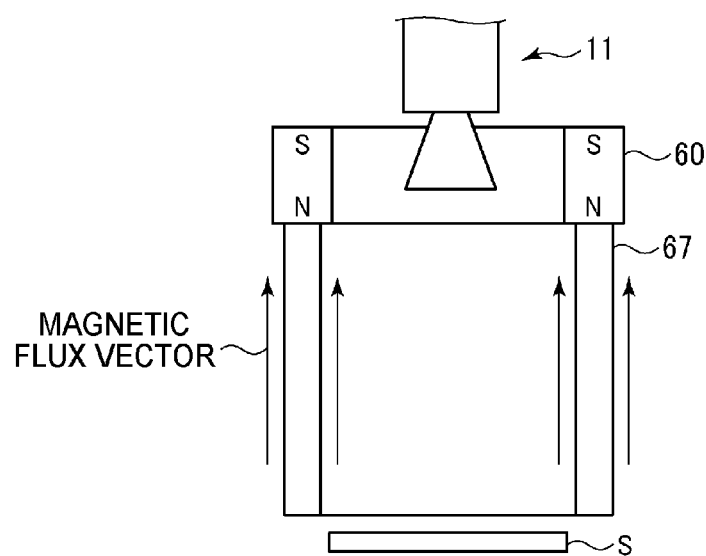
FIG. 25 is a view illustrating an example in which a tubular yoke is provided from a magnet toward a substrate.

Further, as illustrated in FIG. 25, a tubular yoke 67 made of a soft magnetic material (e.g., an iron material or a stainless steel (SUS) material) may be provided to be oriented from the magnet 60 toward the substrate S. The magnetic field generated from the magnet 60 reaches the vicinity of the substrate S by the yoke 67, so that the plasma may be guided from the cluster nozzle 11 portion to the substrate S side.

In the present exemplary embodiment, since the charged components are trapped by the magnetic field generated from the magnet 60, it is possible to trap and decelerate the monomer ions mi, and reduce the possibility that the monomer ions mi cause excessive ion damage to the substrate S. Meanwhile, the gas clusters injected from the gas cluster nozzle 11 are also ionized in the plasma. However, since the gas clusters have a very heavy weight compared with the monomer ions, the gas clusters fly toward the substrate S without being affected by the trap in the magnetic field region. Of course, even in such a case, there is a possibility that the monomer ions mi may cause excessive ion damage to the substrate S. In that case, the irradiation of the monomer ions onto the substrate S is reduced by using a skimmer or a neutralizer as in the previous exemplary embodiment. Further, an acceleration electrode may be provided between the cluster nozzle 41 and the substrate S to further accelerate the ionized gas clusters Ci.

Descriptions have been made on an example in which the magnet 60 is added to the processing apparatus of the first exemplary embodiment. However, without being limited thereto, in the present exemplary embodiment, a magnet may be added to the processing apparatus of the second exemplary embodiment. In this case, the same effect may be obtained as well. In addition, this is also applicable to the arrangement of magnets is the same, and the examples of FIGS. 24 and 25 may be similarly applied.

The present exemplary embodiment adds an effect of trapping charged components in a desired portion by using a magnet and generating plasma in a desired region to the first and second exemplary embodiments, and the basic processing is the same as in the first and second exemplary embodiments. That is, the ionized gas clusters Ci are accelerated by the potential difference so that the physical energy of the gas clusters themselves increase. Thus, since the ionized gas clusters Ci may collide with the substrate S with higher energy than neutral gas clusters, the cleaning effect on the surface of the substrate S may be enhanced. In addition, the cluster generation gas flowing through the cluster nozzle without being clustered and the reactive gas are excited by the plasma to become monomer ions mi and radicals mr, and effectively act on substances reactive to the substances present on the substrate S. Therefore, of course, the applications of FIGS. 5 to 8B exemplified in the first exemplary embodiment may also be applied to the present exemplary embodiment.

In the present exemplary embodiment, descriptions have been made on an example in which a ring-shaped magnet is provided as the magnet 60, but the present disclosure is not limited thereto. As long as a magnetic field is generated in the gas injection region of the cluster nozzle, charged components are trapped in the magnetic field, and the plasma generation region is defined in the portion where the charged components are trapped, the magnet 60 is not limited to the ring-shaped magnet, but may be, for example, two flat plate-like magnets.

<Other Applications>

The present disclosure is not limited to the above-described exemplary embodiments, and various modifications may be made thereto. For example, in the above-described exemplary embodiments, the DC discharge method and the ICP method are exemplified as a method for generating plasma in the cluster nozzle portion, but the present disclosure is not limited thereto.

Further, in the above-described exemplary embodiments, descriptions have been made on an example in which the ionized gas clusters are accelerated to irradiate the substrate S serving as the workpiece. However, in the case where a processing is mainly performed with monomer ions or radicals, acceleration of the ionized gas clusters is not necessary.

Furthermore, in the above-described exemplary embodiments, the present disclosure is applied to the substrate cleaning process. However, the workpiece is not limited to the substrate, and the applied processing is not limited to cleaning, but the present disclosure may be applied to other processings such as, for example, machining.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A processing method comprising:
disposing a workpiece in a processing container of a processing apparatus, and exhausting an atmosphere of the processing container through an exhaust thereby maintaining an inside of the processing container in a vacuum state;
providing a cluster nozzle including a nozzle tip and a base positioned above the nozzle tip in the processing container, the base being attached to the processing container via an insulator;
supplying a cluster generating gas from a first gas supply to the cluster nozzle and adiabatically expanding the cluster generating gas in the cluster nozzle, thereby generating gas clusters;
generating plasma in the cluster nozzle using a plasma generator including a DC power source to ionize the gas clusters and injecting the ionized gas clusters from the cluster nozzle into the processing container, thereby performing a predetermined processing by irradiating an excited component including the ionized gas clusters onto the workpiece;
supplying a reactive gas from a second gas supply to the cluster nozzle and exposing the reactive gas to the plasma, thereby exciting the reactive gas by the plasma in the cluster nozzle such that the reactive gas becomes monomer ions or radicals; and
supplying the monomer ions or radicals to the processing container, thereby exerting a chemical reaction on a substance present on a surface of the workpiece.

2. The processing method of claim 1, further comprising:
accelerating the ionized gas clusters injected from the cluster nozzle toward the workpiece.

3. The processing method of claim 2, wherein a DC voltage is applied to the cluster nozzle to generate a potential difference between the cluster nozzle and the workpiece, and generate the plasma in the cluster nozzle by DC discharge.

4. The processing method of claim 1, wherein the plasma generated in the cluster nozzle is inductively coupled plasma.

5. The processing method of claim 1, wherein particles attached on a surface of the workpiece is removed by irradiating the ionized gas clusters onto the workpiece.

6. The processing method of claim 1, further comprising:
generating a magnetic field in a gas injection region of the cluster nozzle by a magnet so as to trap charged components such as electrons or ions in the magnetic field and define a plasma generation region in a portion where the charged components are trapped.

7. The processing method of claim 6, wherein the magnet is disposed such that a position where a magnetic field intensity of the magnet becomes maximum is the same as a position of an outlet of the cluster nozzle, or the outlet of the cluster nozzle is closer to the workpiece than the position where the magnetic field intensity of the magnet becomes maximum.

8. A processing method comprising:
disposing a workpiece in a processing container of a processing apparatus, and exhausting an atmosphere of the processing container through an exhaust thereby maintaining an inside of the processing container in a vacuum state;

providing a cluster nozzle including a nozzle tip and a base positioned above the nozzle tip in the processing container, the base being attached to the processing container via an insulator;

supplying a cluster generating gas from a first gas supply to the cluster nozzle and adiabatically expanding the cluster generating gas in the cluster nozzle, thereby generating gas clusters;

generating a magnetic field around the cluster nozzle by a magnet so as to trap charged components including electrons or ions in a gas injection region of the cluster nozzle using the magnetic field;

generating plasma in the cluster nozzle using a plasma generator including a DC power source to ionize the gas clusters and injecting the ionized gas clusters from the cluster nozzle into the processing container, thereby performing a predetermined processing by irradiating an excited component including the ionized gas clusters onto the workpiece;

supplying a reactive gas from a second gas supply to the cluster nozzle and exposing the reactive gas to the plasma, thereby exciting the reactive gas by the plasma in the cluster nozzle such that the reactive gas becomes monomer ions or radicals; and supplying the monomer ions or radicals to the processing container, thereby exerting a chemical reaction on a substance present on a surface of the workpiece.

9. The method of claim 8, further comprising:
defining a plasma generation region in a portion where the charged components are trapped.

10. A processing method comprising:
providing a processing apparatus including:
  a processing container configured to dispose therein a workpiece;
  an exhaust configured to exhaust an atmosphere in the processing container;
  a first gas supply configured to supply a cluster generating gas and a second gas supply configured to supply a reactive gas;
  a cluster nozzle including a nozzle tip and a base positioned above the nozzle tip, the base being attached to the processing container via an insulator and the cluster nozzle being provided in the processing container and configured to generate gas clusters by adiabatically expanding the cluster generating gas supplied from the first gas supply therein and inject a gas component containing the generated gas clusters into the processing container; and
  a plasma generator configured to generate plasma in the cluster nozzle and including a DC power source connected directly to the base,
disposing the workpiece in the processing container and exhausting the atmosphere of the processing container through the exhaust thereby maintaining an inside of the processing container in a vacuum state;
generating gas clusters by supplying the cluster generating gas from the first gas supply, and adiabatically expanding the cluster generating gas in the cluster nozzle;
generating plasma in the cluster nozzle using the plasma generator to ionize the gas clusters and injecting the ionized gas clusters from the cluster nozzle into the processing container, thereby performing a predetermined processing by irradiating an excited component including the ionized gas clusters onto the workpiece; and exciting the reactive gas by the plasma in the cluster nozzle such that the reactive gas becomes monomer ions or radicals, and supplying the monomer ions or radicals to the processing container thereby exerting a chemical reaction on a substance present on a surface of the workpiece.

11. The processing method of claim 10, further comprising:
accelerating the ionized gas clusters injected from the cluster nozzle toward the workpiece.

12. The processing method of claim 11, wherein a DC voltage is applied to the cluster nozzle to generate a potential difference between the cluster nozzle and the workpiece, and generate the plasma in the cluster nozzle by DC discharge.

13. The processing method of claim 10, wherein the plasma generated in the cluster nozzle is inductively coupled plasma.

14. The processing method of claim 10, wherein particles attached on a surface of the workpiece is removed by irradiating the ionized gas clusters onto the workpiece.

15. The processing method of claim 10, further comprising:
generating a magnetic field in a gas injection region of the cluster nozzle by a magnet so as to trap charged components such as electrons or ions in the magnetic field and define a plasma generation region in a portion where the charged components are trapped.

16. The processing method of claim 15, wherein the magnet is disposed such that a position where a magnetic field intensity of the magnet becomes maximum is the same as a position of an outlet of the cluster nozzle, or the outlet of the cluster nozzle is closer to the workpiece than the position where the magnetic field intensity of the magnet becomes maximum.

17. A processing method comprising:
providing a processing apparatus including:
  a processing container configured to dispose therein a workpiece;
  an exhaust configured to exhaust an atmosphere in the processing container;
  a first gas supply configured to supply a cluster generating gas and a second gas supply configured to supply a reactive gas;
  a cluster nozzle including a nozzle tip and a base positioned above the nozzle tip, the base being attached to the processing container via an insulator and the cluster nozzle being provided in the processing container and configured to generate gas clusters by adiabatically expanding the cluster generating gas supplied from the first gas supply therein and inject a gas component containing the generated gas clusters into the processing container; and
  a plasma generator configured to generate plasma in the cluster nozzle and including a DC power source connected directly to the base,
disposing the workpiece in the processing container and exhausting the atmosphere of the processing container through the exhaust thereby maintaining an inside of the processing container in a vacuum state;
generating gas clusters by supplying the cluster generating gas from the first gas supply, and adiabatically expanding the cluster generating gas in the cluster nozzle;

generating a magnetic field around the cluster nozzle by a magnet so as to trap charged components including electrons or ions in a gas injection region of the cluster nozzle using the magnetic field;

generating plasma in the cluster nozzle using the plasma generator to ionize the gas clusters and injecting the ionized gas clusters from the cluster nozzle into the processing container, thereby performing a predetermined processing by irradiating an excited component including the ionized gas clusters onto the workpiece; and exciting the reactive gas by the plasma in the cluster nozzle such that the reactive gas becomes monomer ions or radicals, and supplying the monomer ions or radicals to the processing container, thereby exerting a chemical reaction on a substance present on a surface of the workpiece.

18. The method of claim 17, further comprising:

defining a plasma generation region in a portion where the charged components are trapped.

* * * * *